(12) United States Patent
Lee et al.

(10) Patent No.: US 12,101,873 B2
(45) Date of Patent: Sep. 24, 2024

(54) FLEXIBLE PRINTED CIRCUIT CABLE ASSEMBLY WITH ELECTROMAGNETIC SHIELDING

(71) Applicant: Microsoft Technology Licensing, LLC, Redmond, WA (US)

(72) Inventors: Jaejin Lee, Redmond, WA (US); Edward Charles Leacock, Seattle, WA (US); Charbel Khawand, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 149 days.

(21) Appl. No.: 17/660,618

(22) Filed: Apr. 25, 2022

(65) Prior Publication Data

US 2023/0345618 A1 Oct. 26, 2023

(51) Int. Cl.
*G06F 1/16* (2006.01)
*H05K 1/02* (2006.01)
(Continued)

(52) U.S. Cl.
CPC ......... *H05K 1/0218* (2013.01); *G06F 1/1681* (2013.01); *H05K 1/0216* (2013.01);
(Continued)

(58) Field of Classification Search
CPC .... H05K 1/0218; H05K 1/0393; H05K 1/189; G06F 1/1681
See application file for complete search history.

(56) References Cited

U.S. PATENT DOCUMENTS 5,610,368 A * 3/1997 Smith ............... H02G 3/22
333/182
6,956,173 B2 10/2005 Awakura et al.
(Continued)

FOREIGN PATENT DOCUMENTS

CN 202110855 U 1/2012
CN 202633671 U 12/2012
(Continued)

OTHER PUBLICATIONS

English language translation of WO2021158041, 2021.*
(Continued)

*Primary Examiner* — Anthony M Haughton
*Assistant Examiner* — Theron S Milliser
(74) *Attorney, Agent, or Firm* — Alleman Hall & Tuttle LLP

(57) ABSTRACT

An FPC cable assembly is provided that includes a first ground layer, a second ground layer, and at least one signal line sandwiched by the first and second ground layers. The FPC cable assembly further includes an electromagnetic shielding structure including a first magnetic layer at least partially covering and electrically grounded to the first ground layer, a second magnetic layer at least partially covering and electrically grounded to the second ground layer, and a plurality of magnetic rings magnetically engaged with and electrically contacting the first magnetic layer and the second magnetic layer so as to surround the first and second ground layers, the at least one signal line, and the first and second magnetic layers, thereby providing electromagnetic shielding of the at least one signal line.

20 Claims, 8 Drawing Sheets

(51) Int. Cl.
 *H05K 1/03* (2006.01)
 *H05K 1/18* (2006.01)
(52) U.S. Cl.
 CPC ............ *H05K 1/0393* (2013.01); *H05K 1/18* (2013.01); *H05K 1/189* (2013.01); *H05K 2201/05* (2013.01); *H05K 2201/08* (2013.01); *H05K 2201/083* (2013.01)

(56) References Cited

U.S. PATENT DOCUMENTS

| | | | | |
|---|---|---|---|---|
| 8,039,763 | B1* | 10/2011 | Cochrane | H05K 9/0009 |
| | | | | 361/679.02 |
| 10,225,934 | B2* | 3/2019 | Kegeler | H01F 3/10 |
| 10,269,469 | B2* | 4/2019 | Yosui | H01P 3/026 |
| 10,741,303 | B2* | 8/2020 | Yosui | H01P 3/026 |
| 2009/0084586 | A1* | 4/2009 | Nielsen | H05K 1/0218 |
| | | | | 29/829 |
| 2017/0156210 | A1* | 6/2017 | Kegeler | H01F 3/10 |
| 2017/0194076 | A1* | 7/2017 | Yosui | H05K 1/0219 |
| 2019/0198195 | A1* | 6/2019 | Yosui | H01B 7/08 |
| 2020/0060020 | A1* | 2/2020 | Park | G06F 1/1652 |
| 2021/0119350 | A1* | 4/2021 | Zegarra | H01Q 1/526 |
| 2022/0310883 | A1* | 9/2022 | Takeya | H01L 33/62 |
| 2023/0236668 | A1* | 7/2023 | Glad | H01Q 1/2266 |
| | | | | 345/174 |

FOREIGN PATENT DOCUMENTS

| | | |
|---|---|---|
| CN | 102117684 B | 4/2013 |
| CN | 208013605 U | 10/2018 |
| JP | 2003036733 A | 2/2003 |
| JP | 5418967 B2 | 11/2013 |
| JP | 6107163 B2 | 3/2017 |
| KR | 20210099766 A | 8/2021 |
| WO | 2021158041 A1 | 8/2021 |

OTHER PUBLICATIONS

"International Search Report and Written Opinion Issued in PCT Application No. PCT/US23/012472", Mailed Date: Jun. 9, 2023, 13 Pages.

Yogendrappa, Milan, "Best EMI and RF Shielding Methods for Flex PCBs", Retrieved from: https://www.protoexpress.com/blog/emi-rf-shielding-methods-flex-pcbs/, Oct. 26, 2021, 15 Pages.

* cited by examiner

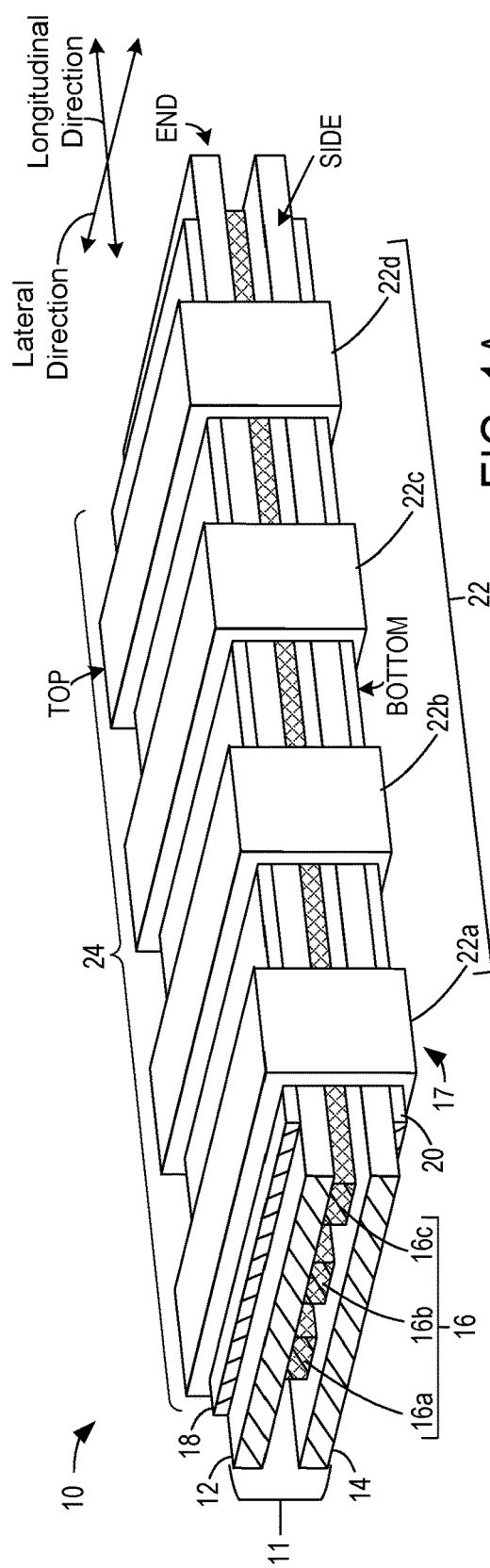
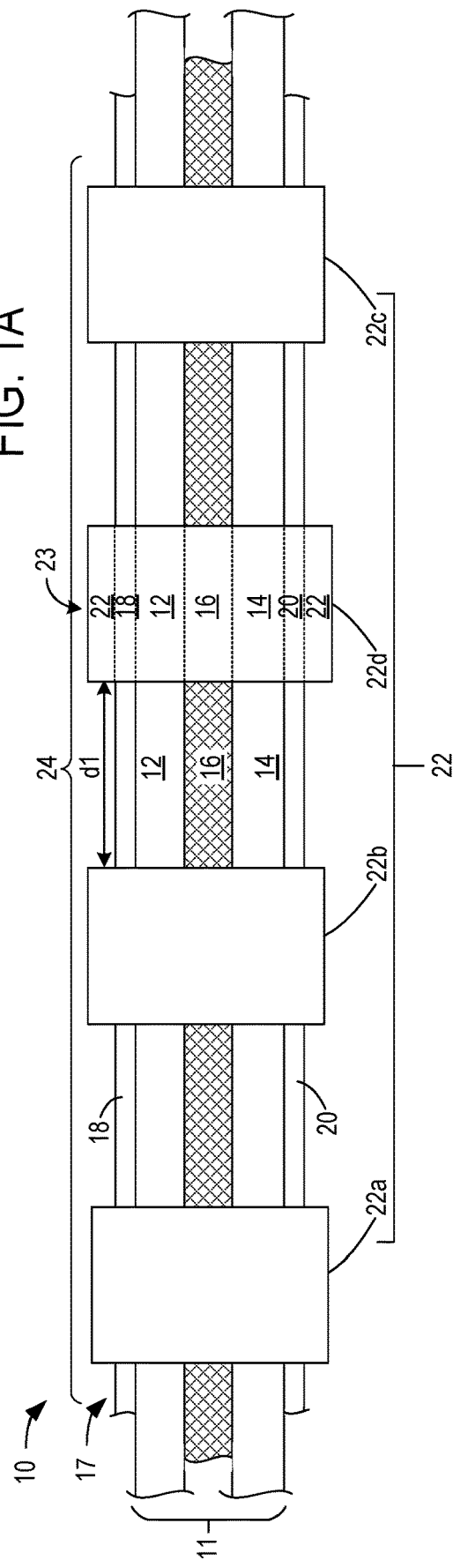
FIG. 1A
FIG. 1B

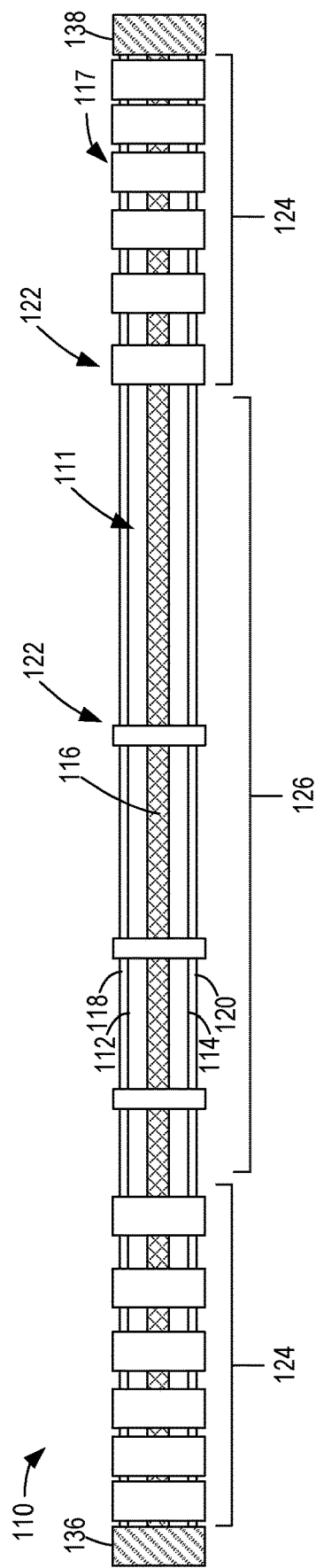

200

```
┌─────────────────────────────────────────────────────────────────────┐
│ PROVIDE AN FPC CABLE WITH A FIRST GROUND LAYER, A SECOND GROUND     │
│ LAYER, AND AT LEAST ONE SIGNAL LINE SANDWICHED BETWEEN THE FIRST    │
│ GROUND LAYER AND THE SECOND GROUND LAYER 202                        │
└─────────────────────────────────────────────────────────────────────┘
                                    ↓
┌─────────────────────────────────────────────────────────────────────┐
│    SHIELD THE FLEXIBLE PRINTED CIRCUIT CABLE WITH AN ELECTROMAGNETIC│
│                     SHIELDING STRUCTURE 204                         │
│                                                                     │
│   ┌─────────────────────────────────────────────────────────────┐   │
│   │ AT LEAST PARTIALLY COVER THE FIRST GROUND LAYER WITH A FIRST│   │
│   │ MAGNETIC LAYER ON AN OUTSIDE THEREOF AND ELECTRICALLY GROUND│   │
│   │ THE FIRST MAGNETIC LAYER TO THE FIRST GROUND LAYER 206      │   │
│   └─────────────────────────────────────────────────────────────┘   │
│                                 ↓                                   │
│   ┌─────────────────────────────────────────────────────────────┐   │
│   │ AT LEAST PARTIALLY COVER THE SECOND GROUND LAYER WITH A SECOND│ │
│   │ MAGNETIC LAYER ON AN OUTSIDE THEREOF AND ELECTRICALLY GROUND │  │
│   │ THE SECOND MAGNETIC LAYER TO THE SECOND GROUND LAYER 208     │  │
│   └─────────────────────────────────────────────────────────────┘   │
│                                 ↓                                   │
│   ┌─────────────────────────────────────────────────────────────┐   │
│   │ MAGNETICALLY ENGAGE AND ELECTRICALLY CONTACT A PLURALITY OF │   │
│   │ MAGNETIC RINGS WITH THE FIRST MAGNETIC LAYER AND THE SECOND │   │
│   │ MAGNETIC LAYER SO AS TO SURROUND THE FIRST AND SECOND GROUND│   │
│   │ LAYERS, THE AT LEAST ONE SIGNAL LINE, AND THE FIRST AND     │   │
│   │ SECOND MAGNETIC LAYERS 210                                  │   │
│   └─────────────────────────────────────────────────────────────┘   │
└─────────────────────────────────────────────────────────────────────┘
```

FIG. 7

FLEXIBLE PRINTED CIRCUIT CABLE ASSEMBLY WITH ELECTROMAGNETIC SHIELDING

BACKGROUND

Flexible printed circuit (FPC) cables are used as electrical connectors in various electronic devices. FPC cables can be manufactured using photolithography or other techniques and provide an electronic circuit that has the ability to flex. The ability of these cables to flex offers advantages over rigid electrical connectors, such as space savings, installation ease, and ability to route around other components. FPC cables are suitable not only for traversing fixed paths that include tight bends, but also for repeatedly flexing during normal use such as when installed in a hinge of an electronic device, for example. As a result of their broad utility, FPC cable adoption has been widespread.

SUMMARY

According to one aspect of the present disclosure, an FPC cable assembly is provided comprising an FPC cable that includes a first ground layer, a second ground layer, and at least one signal line sandwiched by the first ground layer and the second ground layer. The FPC cable assembly further includes an electromagnetic shielding structure configured to electromagnetically shield the FPC cable. The electromagnetic shielding structure includes a first magnetic layer at least partially covering the first ground layer on an outside thereof and being electrically grounded to the first ground layer, a second magnetic layer at least partially covering the second ground layer on an outside thereof and electrically grounded to the second ground layer, and a plurality of magnetic rings magnetically engaged with and electrically contacting the first magnetic layer and the second magnetic layer so as to surround the first and second ground layers, the at least one signal line, and the first and second magnetic layers, thereby providing electromagnetic shielding of the signal lines.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 1A shows a partial perspective view of a first section of an FPC cable assembly in accordance with a first example of the present disclosure.

FIG. 1B shows a side view of the first section of the FPC cable assembly of FIG. 1.

FIG. 5 shows a side view of an FPC cable assembly in accordance with a second example of the present disclosure, with varying distances between magnetic rings.

FIG. 7 shows a method of manufacturing the FPC cable assembly of FIG. 1 in accordance with an example of the present disclosure.

DETAILED DESCRIPTION

Figure 2:
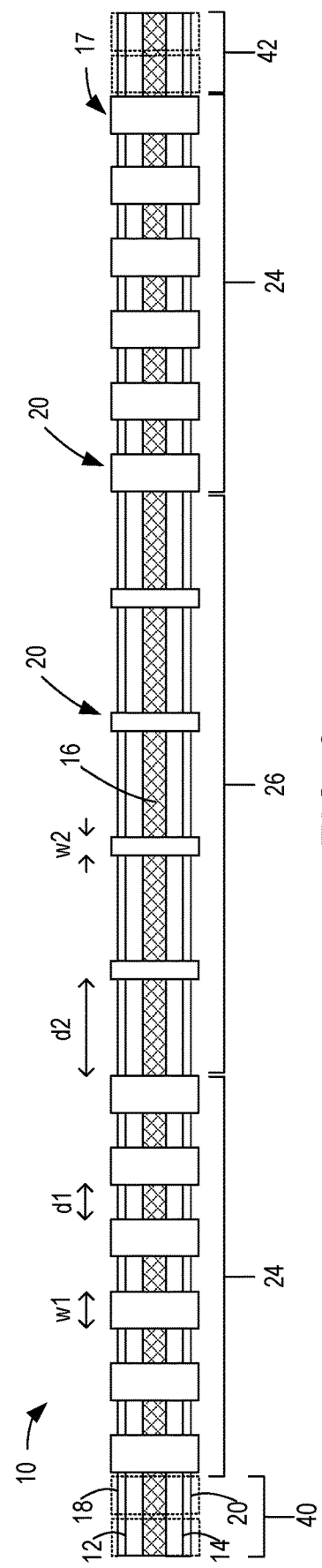
FIG. 2 shows a side view of the FPC cable assembly that is partially shown in FIG. 1, without end connectors.

Despite being widely adopted in a variety of electronic devices as described above, conventional FPC cables can suffer from the drawback that they can interfere with wireless communications. For example, many wireless communication enabled devices such as laptop computers, tablet computers, mobile phones, routers, etc., include FPC cables. These devices are configured to exchange data via wireless radios that establish wireless connections between the devices. Unfortunately, wireless connections are vulnerable to electromagnetic interference (EMI). One source of EMI is unwanted radiofrequency (RF) emissions from the FPC cables included in these electronic devices, which can be picked up by RF antennas of the wireless radios and interfere with signal reception. Such interference may result in RF desensitization of the wireless radios in these devices, which limits the radio ranges of the devices.

In one prior approach to address this issue, conductive EMI film is applied to the top and bottom surface of the FPC cable in an attempt to reduce electromagnetic emissions. However, the lack of shielding along the sides of the FPC cable in this approach still allows electromagnetic emission to escape from the sides of the FPC cable. This leakage from the sides can unfortunately interfere with wireless communications. The leakage can be especially pronounced for FPC cables carrying high bit-rate signals.

To address the issues discussed above, an FPC cable assembly 10 is provided according to a first example of the present disclosure. In the perspective view of FIG. 1A and the side view of FIG. 1B, a first section 24 of the FPC cable assembly 10 is illustrated. For ease of illustration, the scale of the components of the FPC cable assembly 10 is exaggerated in some aspects. For example, it will be appreciated that the top and bottom surfaces of the FPC cable assembly as viewed in FIG. 1A are much larger than the thickness of the side edge, and thus the thickness of the side edge is exaggerated in these views so that the layers within can be seen. The FPC cable assembly 10 includes an FPC cable 11 including a first ground layer 12, a second ground layer 14, and a plurality of signal lines 16 sandwiched by the first ground layer 12 and the second ground layer 14. The FPC cable assembly 10 further includes an electromagnetic shielding structure 17 configured to electromagnetically shield the FPC cable 11. The electromagnetic shielding structure 17 includes a first magnetic layer 18 at least partially covering the first ground layer 12 on an outside thereof and being electrically grounded to the first ground layer 12. The electromagnetic shielding structure 17 further includes a second magnetic layer 20 at least partially covering the second ground layer 14 on an outside thereof and being electrically grounded to the second ground layer 14. The electromagnetic shielding structure 17 further includes a plurality of magnetic rings 22 magnetically engaged with and electrically contacting the first magnetic layer 18 and the second magnetic layer 20 so as to surround the first and second ground layers 12, 14, the signal lines 16, and the first and second magnetic layers 18, 20. As viewed from the side in FIG. 1B, the stacking order 23 of the layers from a bottom to a top side of the stack is (1) magnetic ring 22, (2) second magnetic layer 20, (3) second ground layer 14, (4) signal lines 16, (5) first ground layer 12, (6) first magnetic layer 18, and (7) magnetic ring 22. A potential technical benefit of using an electromagnetic shielding structure of this configuration is that the magnetic rings 22 and first and second magnetic layers 18, 20 act as Faraday cage surrounding the FPC cable, thereby inhibiting EMI.

In the depicted example first section 24 of the FPC cable assembly 10, there are three signal lines 16 (first signal line 16a, second signal line 16b, third signal line 16c) and four magnetic rings 22 (first magnetic ring 22a, second magnetic ring 22b, third magnetic ring 22c, fourth magnetic ring 22d) illustrated. The magnetic rings 22 and the surfaces of the magnetic layers 18, 20 directly interact with each other electrically and magnetically without intervening insulating layers, so that the magnetic rings 22 are mechanically locked or retained in specific positions while in conductive contact with the first and second magnetic layers 18, 20. The signal lines 16 are encased in an electrically non-conducting, insulator material such as polyimide, polyethylene terephthalate (PET), or polyethylene naphthalate (PEN). The first and second ground layers 12, 14 include conductive traces acting as ground lines, which are surrounded by a similar insulator material. The first magnetic layer 18 and second magnetic layer 20 may be electrically connected to the ground lines in the first and second ground layers 12, 14 using vias along the length of the FPC cable 11, or at the end connectors 36, 38 described below. The first and second magnetic layers 18, 20, and the magnetic rings 22 may be coated in an insulator material on an outside, and in such a configuration conductive paths between these components may be provided using vias or other exposed areas in which the insulator material is removed to allow direct electrical contact between the magnetic layers 18, 20 and the magnetic rings 22.

Typically, the first magnetic layer 18 is made of a hard magnetic material layer, the second magnetic layer 20 is also made of a hard magnetic material, and the plurality of magnetic rings 22 are made of a soft magnetic material. Accordingly, it should be understood that, in the depicted example, the first magnetic layer 18 is a first hard magnetic layer, the second magnetic layer 20 is a second hard magnetic layer, and the plurality of magnetic rings 22 are a plurality of soft magnetic rings. In this configuration, the first hard magnetic layer 18 and the second hard magnetic layer 20 have a hard coercivity which is higher than a predetermined coercivity threshold, which may be 10 kA/m, for example. This value should be understood to be exemplary, and other values are possible. The plurality of soft magnetic rings 22 have a soft coercivity which is lower than the hard coercivity. A potential technical advantage of differing coercivities is that the lower coercivity of the soft magnetic rings 22 can improve their performance as electromagnetic shielding material, whereas the higher coercivity of the hard magnetic layers 18, 20 enables these layers to keep their magnetic charge as permanent magnets, thereby enabling these layers to fix the soft magnetic ring 22 positions through magnetic attractive forces. Regarding magnetic permeability, in one example configuration the soft magnetic rings 22 may have magnetic permeability greater than 2, while the hard magnetic materials may have a magnetic permeability in the range of 1 to 2. Magnetic permeabilities in these ranges improve the shielding effect of combined FPC cable 11, while still enabling the layers 18, 20 to be made of a hard magnetic material, as higher magnetic permeability enables the material to pull other magnetic fields within itself to act as a magnetic shield. Regarding specific materials, the soft magnetic rings may comprise at least one of iron (Fe) or nickel-iron alloy (Ni—Fe), for example, or other suitable soft magnetic alloys. The first and second hard magnetic layers 18, 20 may comprise at least one of samarium-cobalt (Sm—Co) or neodymium (NdFeB), for example, or other suitable hard magnetic alloys. The first and second magnetic layers 18, 20 and the plurality of magnetic rings 22 are configured to provide electromagnetic shielding of the plurality of signal lines 16, to thereby reduce electromagnetic interference with wireless radio transceivers 52 and other components in the electronic device 5 in which the FPC cable assembly 10 is installed, as described below in relation to FIGS. 3 and 4A-4C. A potential technical benefit of using magnetic materials such as those described above for the magnetic rings 22 and the first and second magnetic layers 18, 20, is that they can absorb and/or weaken the electromagnetic waves emitted by the signal lines 16, further reducing EMI caused by the signal lines 16. There is also a potential technical benefit of using both soft and hard magnetic materials in the rings 22 and layers 18, 20, namely, that the soft magnetic layers offer superior magnetic shielding performance while the hard magnetic layers are permanently magnetized and thus promote secure attachment through magnetic forces between the rings 22 and the layers 18, 20. This helps ensure that the rings stay in position during installation and use, while also ensuring sufficient shielding performance.

Although the first magnetic layer 18 and the second magnetic layer 20 are hard magnetic layers and the plurality of magnetic rings 22 are soft magnetic rings, it will be appreciated that, in alternative examples, the first magnetic layer 18 and the second magnetic layer 20 may be soft magnetic layers and the plurality of magnetic rings 22 may be hard magnetic rings. Further, in alternative examples, only one of the first and second layers 12, 14 may be configured as a ground layer for the electromagnetic shielding structure 17.

Continuing with FIGS. 1A and 1B, the plurality of magnetic rings 22 includes a plurality of pairs of adjacent magnetic rings 22, and each pair of adjacent magnetic rings 22 are separated by a respective distance d along the longitudinal direction of the FPC cable assembly 10. Examples of distance d are illustrated and labeled in FIGS. 1B, 2, and 3 as d1, d2, d3 and d4. Distance d is defined by and computed according to the formula:

$$d \leq c/(4f),$$

where c is the speed of light and f is a largest frequency of radiated emissions from the signal lines 16 of the FPC cable assembly 10 that are desired to be inhibited. This frequency will be chosen to correspond to the largest frequency of signals of communications of the wireless radio transceiver for which EMI is sought to be inhibited. It will be appreciated that each of d1, d2, d3, and d4, as well as the varying distances shown in FIG. 5 are computed according to, and thus satisfy, this formula.

Separation of each pair of the magnetic rings 22 by the respective distances provides the FPC cable assembly 10 with the ability to flex and curve, particularly along its longitudinal axis, since it will be appreciated that forming a monolithic or unitary magnetic ring along the entire length of the FPC cable would reduce the flexibility of the cable in the longitudinal direction. Since the shielding effect of the magnetic rings 22 extends into the gap between the magnetic rings 22, the magnetic rings 22 can provide effective electromagnetic shielding when the distance is set appropriately. The distances between the magnetic rings 22 may be fixed or may vary depending on both the mechanical flexibility desired and the frequency of EMI emitted from the signal lines 16 that is desired to shielded, which in turn will depend on the frequency band in which a wireless radio transceiver 52 operates on the electronic device, as described in more detail below.

In the illustrated configuration of FIGS. 1A and 1B, in at least a first section 24 of the FPC cable assembly 10, the distance separating the adjacent pairs of the plurality of magnetic rings 22 is a fixed distance, i.e., a first predetermined distance d1. In one potential configuration, all magnetic rings 22 on the FPC cable assembly 10 may be provided at a fixed distance of the first predetermined distance d1 from each other. In other configurations, as described below, the magnetic rings 22 may be separated by a plurality of different distances. The first predetermined distance d1 may be defined by the formula given above. Examples of communication frequencies for some wireless radio transceivers follow. In the United States, for 5G mobile communications, the largest frequency of the communication band of a 5G wireless radio transceiver of the electronic device may be 7.125 GHz, for example. To inhibit an effect of electromagnetic interference on an operation of such a wireless radio transceiver by EMI emanating from the signal lines 16, d1 may be set to 1.05 centimeters in this case. In Long-Term Evolution (LTE) telecommunications applications, the largest frequency of radiated emissions from an LTE wireless radio transceiver may be 5.9 GHz, for example, and d1 may be 1.27 centimeters. In a different 5G telecommunications application, the largest frequency of radiated emissions from a 5G wireless radio transceiver may be 6.0 GHz, and d1 may be 1.25 centimeters. Other wireless radio transceivers may communicate using other frequency bands, and accordingly the largest frequency of EMI to be inhibited from signal lines 16 may be set in accordance with the highest frequency in those other frequency bands. With this configuration of the magnetic layers 18, 20 and the magnetic rings 22 spaced apart at the distances d1 described above depending on application, radiofrequency emissions that propagate from the FPC cable assembly 10 are attenuated, and thus EMI is reduced.

Referring now to FIG. 2, a side view is shown of the FPC cable assembly 10 including the first section 24 that is partially illustrated in FIG. 1. As shown in this view, in at least a second section 26 of the FPC cable assembly 10, the distance separating the adjacent pairs of the plurality of magnetic rings 22 is a second predetermined distance d2 that is larger than the first predetermined distance d1 between the magnetic rings 22 of the first section 24. In the illustrated example, the second section 26 is provided intermediate a pair of symmetric first sections 24 of the FPC cable assembly 10, which are formed at both ends of the FPC cable assembly 10. Alternatively, the second section 26 may be at one or both ends of the FPC cable assembly 10, or provided in some other arrangement.

Figure 3:
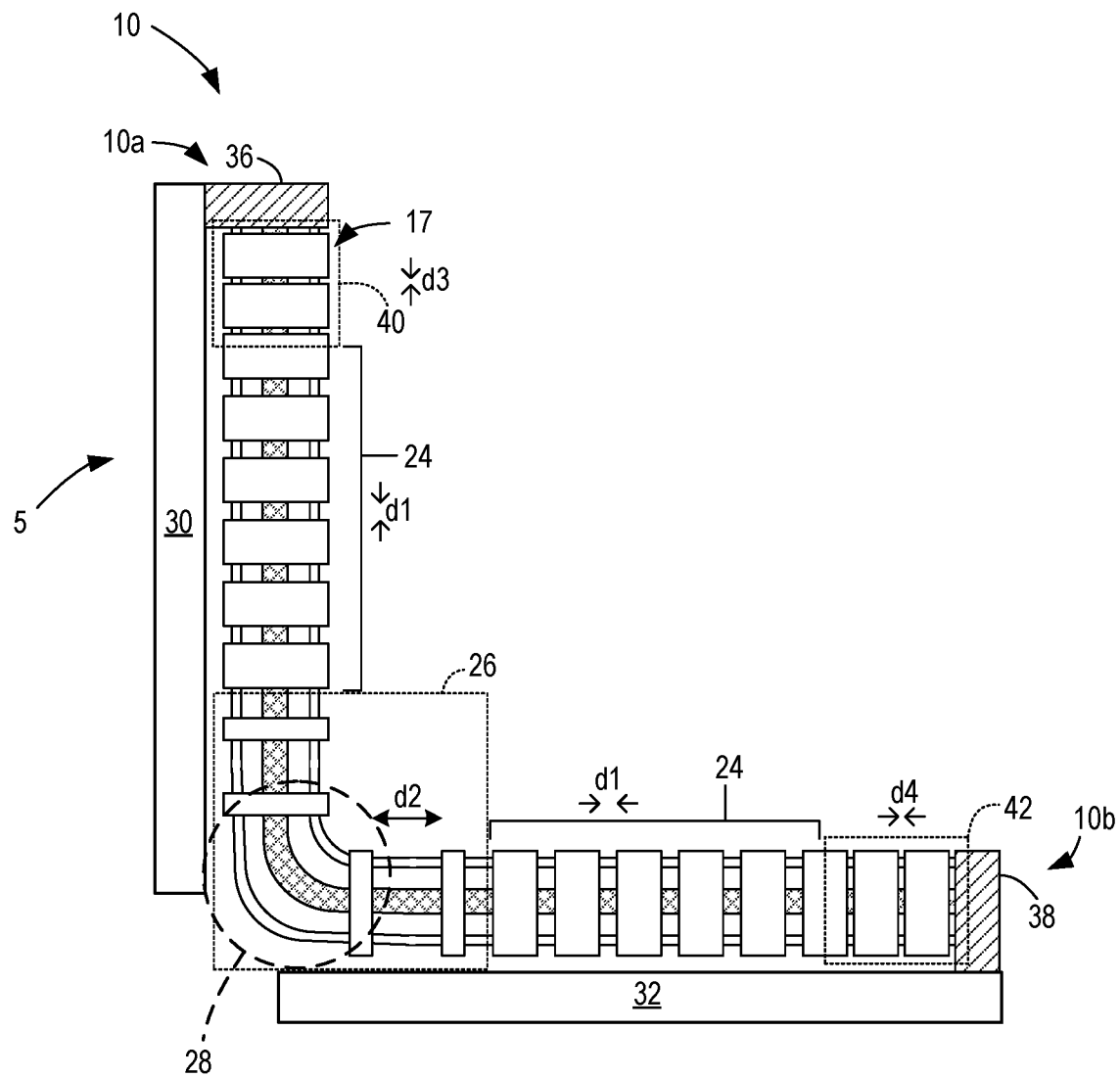
FIG. 3 shows a schematic side view of an example electronic device incorporating the FPC cable assembly of FIG. 2, shown with end connectors.

Not only the distances between the magnetic rings 22 but also the widths of the magnetic rings 22 may vary. Thus, as shown in FIG. 2, widths w1 (as measured in the longitudinal direction of the FPC cable assembly 10) of the plurality of magnetic rings 22 in the first section 24 are greater than widths w2 of the plurality of magnetic rings 22 in the second section 26. In the example of FIG. 2, the widths within each of the first and second sections 24, 26 are fixed (i.e., all rings in a section share the same width), but it will be appreciated widths within a section may also vary. While not shown in FIG. 2, it will be appreciated that end connectors 36, 38 shown in FIG. 3 are typically also provided at the opposite ends of the FPC cable assembly. Varying the widths in this manner has the potential technical benefit of enabling larger widths to be used where more EMI shielding is needed, while also allowing smaller widths to be used in areas where the FPC cable assembly bends and has a greater curvature that would be achievable using the wider widths.

Referring to FIG. 3, a schematic diagram of an electronic device 5 incorporating the FPC cable assembly 10 of FIG. 2 is shown according to one example of the present disclosure. It will be appreciated that electronic device 5 is shown in schematic view, and is a folding computing device such as a laptop, foldable tablet or smart phone, foldable game device, etc. The second section 26 is configured to bend around at least a hinge 28 connecting two portions 30, 32 of the electronic device 5. In this example, the portions 30, 32 comprise a first board 30 and a second board 32 connected by the hinge 28, so that the first section 24 is connects to the first board 30 at one end and another first section 24 connects to the second board 32 at an opposite end, via end connectors 36, 38. The first connector 36 may be connected to a first end 10a of the FPC cable assembly 10 and the second connector 38 connected to a second end 10b of the FPC cable assembly 10, to respectively connect the FPC cable assembly 10 to each of the first board 30 and second board 32. Since the FPC cable assembly 10 wraps around the hinge 28, the second section 26 of the FPC cable assembly 10 is more bent, i.e., has a greater curvature, than the first section 24 of the FPC cable assembly 10, when installed. The larger spacing of the second predetermined distance d2 helps accommodate this curvature, by providing less resistance to bending in the longitudinal direction.

Distances d3 between the plurality of magnetic rings 22 in a third section 40 of the FPC cable assembly 10 adjacent to the first connector 36 and distances d4 between the plurality of soft magnetic rings 22 in a fourth section 42 of the FPC cable assembly 10 adjacent to the second connector 38 are smaller than the distance d1 in the first section 24 and the distance d2 in the second section 26. Therefore, the leakage of radiofrequency emissions can be prevented even in sections of the FPC cable assembly 10 adjacent to the first connector 36 and the second connector 38, which can sometimes be prone to such leakage.

As illustrated by the example of FIG. 3, distances between each of the plurality of soft magnetic rings 22 can be adjusted in a bent section 26 of the FPC cable assembly 10 to meet both mechanical and EMI shielding requirements. The concurrent magnetic- and electrical-contact mechanism of the present disclosure allows flexibility and configurability to change the spacings between the soft magnetic rings 22 while maintaining electrical connection. The magnetic force between the magnetic layers 18, 20 and magnetic rings 22 provides different adjustments of the distances between each of the plurality of magnetic rings 22.

Figure 4A:
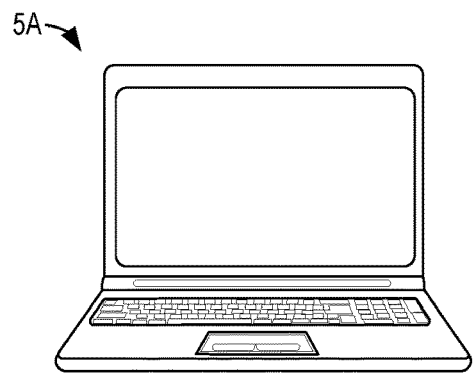
FIGS. 4A-4C respectively show a front view and partial schematic side views of another example electronic device incorporating the FPC cable assembly of FIG. 2.
Figure 4B:
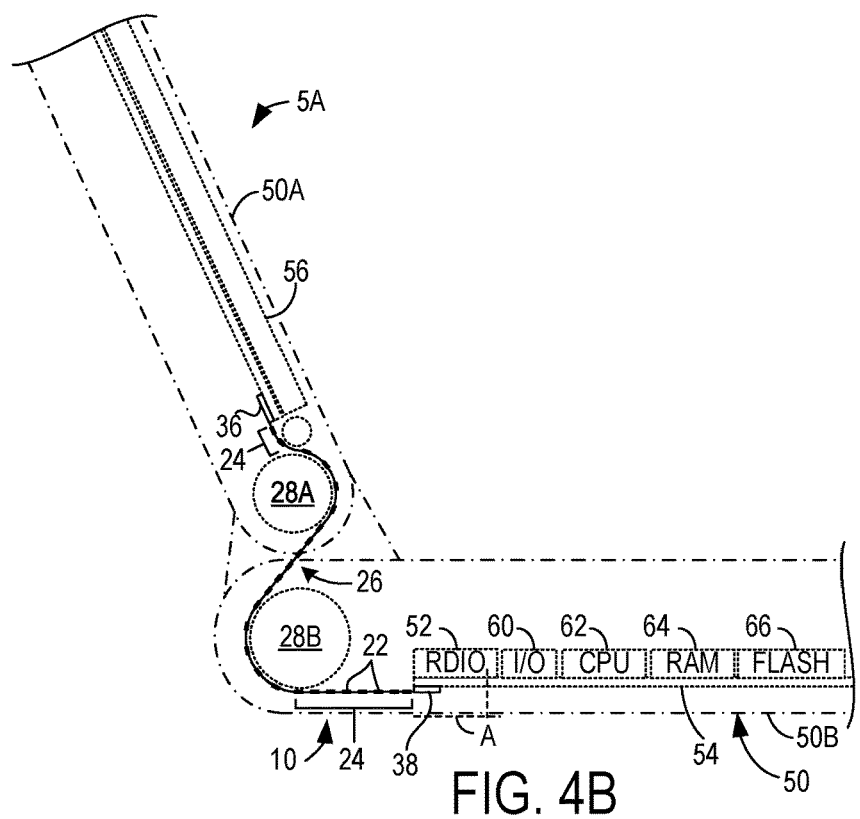
Figure 4C:
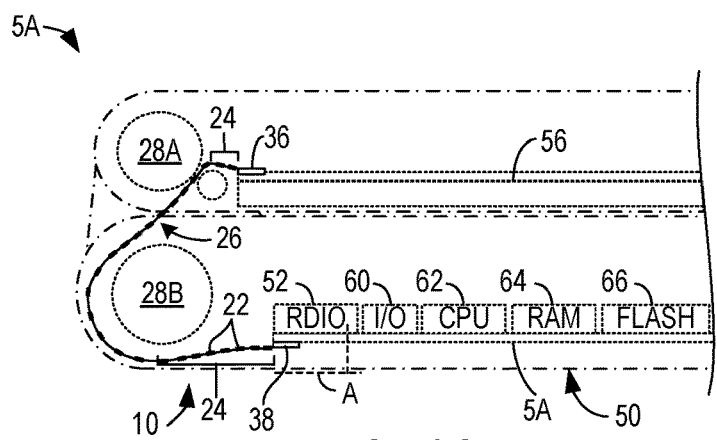

Referring now to FIGS. 4A-4C, a partial schematic view of another example of an electronic device 5A incorporating the FPC cable assembly 10 described herein is shown. Electronic device 5A is in the form of a laptop device, and includes a housing 50, a wireless radio transceiver 52 mounted in the housing, a first electronic component 54 mounted in the housing 50, a second electronic component 56 mounted in the housing 50, and an FPC cable assembly 10 configured to at least partially bend to connect the first electronic component 54 to the second electronic component 56, via respective connectors 36, 38. In one example, the first electronic component 54 is a printed circuit board, and the second electronic component is a display or a printed circuit board. These are merely exemplary, and it will be appreciated that other components may also be connected by the FPC cable assembly 110.

As depicted, to the first electronic component, the wireless radio transceiver 52, an input/output (I/O) module 60, processor (e.g., CPU) 62, volatile memory 64 (e.g., RAM), and non-volatile memory 66 (e.g., FLASH memory) are mounted. It will be noted that the wireless radio transceiver includes an antenna A, at least a portion of which extends outside the housing 50, as typically the housing 50 is metal and interferes with reception. The electronic device 5A further includes a hinge structure with a first hinge 28A and a second hinge 28B, and the housing 50 includes a first housing portion 50A and a second housing portion 50B configured to rotate relative to each other about the first and second hinges 28A, 28B of the hinge structure. The FPC cable assembly 10 is configured to bend around each hinge 28A, 28B in the hinge structure. The FPC cable assembly 10 includes a pair of first sections 24 and a second section 26, as described above. The second section 26 is configured to bend around the hinges 28A, 28B, and each respective distance between each pair of adjacent rings 22 in the second section 26 is larger than each respective distance between each pair of adjacent rings 22 in the pair of first sections 24, to accommodate this bending. The respective distances between adjacent rings 22 in the pair of first sections 24 are a first predetermined distance in length, and the respective distances between the adjacent rings in the second section 26 are a second predetermined distance in length that is larger than the first predetermined distance in length. In alternative embodiments, vary distances may be used, such as in the example of FIG. 5, described below. In FIG. 4B, the hinges 28A, 28B are open and the FPC cable assembly 10 is taut and curves around both hinges 28A, 28B, while in FIG. 4C the hinges 28A, 28B are closed and the FPC cable assembly 10 is relaxed, but still curves as it passes by hinges 28A, 28B. It will be appreciated that barriers other than hinges 28A, 28B within housing 50 may also be routed around by the FPC cable assembly 10, such as standoffs, power supply components, batteries, other printed circuit boards, and other components, for example.

Referring to FIG. 5, a side view is provided of an FPC cable assembly 110 with an alternative arrangement of the magnetic rings 122 in accordance with a second example of the present disclosure. Like parts in this example are numbered similarly to the above example and share their functions, and will not be redescribed except as below for the sake of brevity. Like the FPC cable assembly 10 of the first example, the first FPC cable assembly 110 of the second example includes an FPC cable 111 and an electromagnetic shielding structure 117. The FPC cable includes a first ground layer 112 and a second ground layer 114 that sandwich a plurality of signal lines 116. The electromagnetic shielding structure 117 includes a first magnetic layer 118 and a second magnetic layer 120 that are covered by from respective outer sides (top and bottom side in FIG. 5) and electrically contact the first ground layer 112 and the second ground layer 114, respectively.

The electromagnetic shielding structure 117 further includes a plurality of magnetic rings 122 that surround the FPC cables 112, 114, the signal lines 116, and the hard magnetic layers 118, 120, to thereby inhibit EMI emitted from the signal lines 116. In at least a first section 124 of the FPC cable assembly 110, the adjacent pairs of the plurality of magnetic rings 122 are separated by a first set of distances that vary from each other, and in at least a second section 126 of the FPC cable assembly 110, the adjacent pairs of the plurality of magnetic rings 122 are separated by a second set of distances that vary from each other and all of which are larger than the distances in the first set. The first and second set of distances are computed so as to satisfy the formula described above for the first embodiment. The varying distances can be used to increase or decrease the shielding effect of the electromagnetic shielding structure 117 in certain regions, for example, to increase the shielding effect where more shielding is needed, such as close to a wireless radio transceiver 52 (see FIGS. 4B and 4C), and decrease the shielding effect where less shielding will suffice, such as distant from the wireless radio transceiver 52 (see FIGS. 4B and 4C). The degree of curvature of the FPC cable assembly 110 after assembly may also factor into the variation in distances, with greater distances between magnetic rings 122 accommodating an increase in curvature, and vice versa. It will be appreciated that the FPC cable assembly 110 may be incorporated into the electronic devices 5, 5A of FIGS. 3 and 4A-4C, alternatively or in addition to the FPC cable assembly 10.

Figure 6:
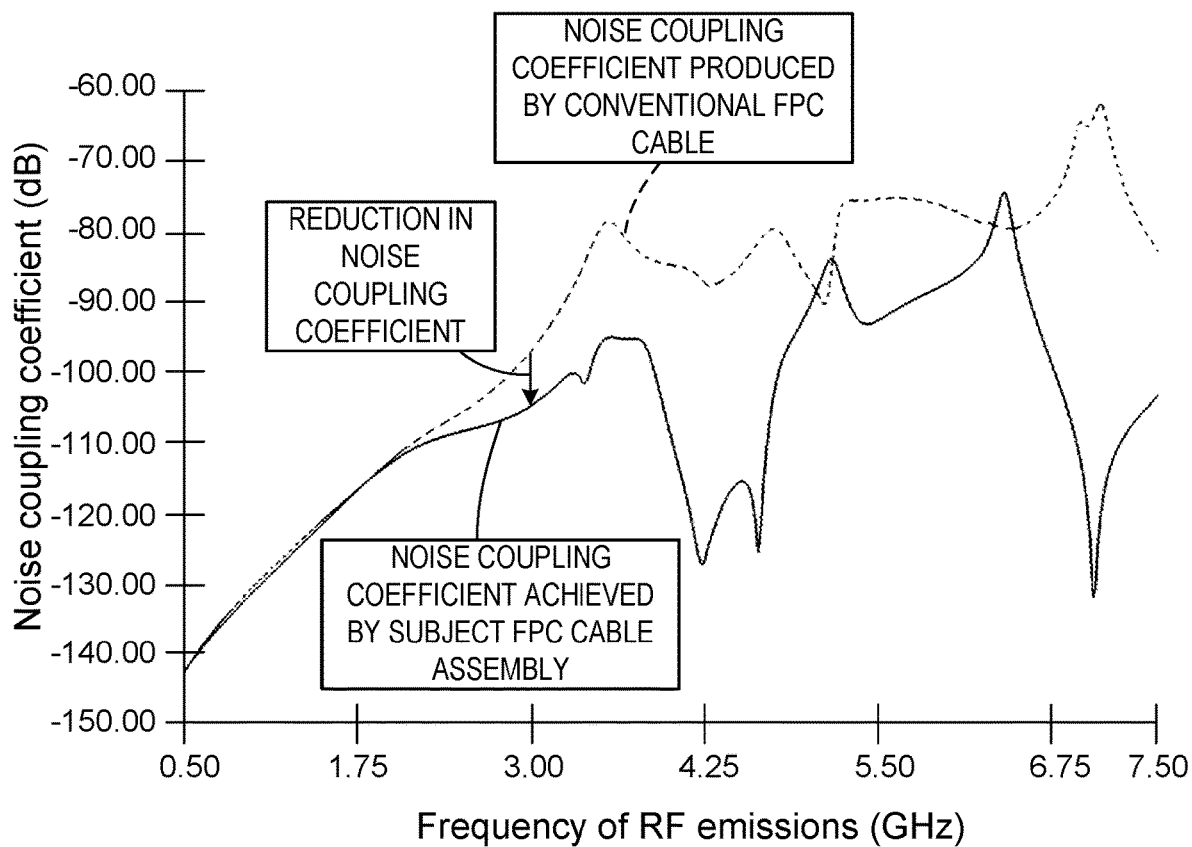
FIG. 6 shows a diagram of the results of a simulation comparing the electromagnetic radiation emitted by an FPC cable assembly according to the present disclosure with a conventional FPC cable with electromagnetic interference (EMI) film shielding on the top and bottom surfaces.

Referring to FIG. 6, results are shown of a three-dimensional simulation comparing the electromagnetic radiation that would be emitted by an electronic device incorporating a FPC cable assembly of the present disclosure to the electromagnetic radiation that would be emitted by an electronic device using conventional EMI film shielding. The noise coupling coefficient was simulated for a range of radiofrequency emissions in the Gigahertz range. As shown in the graph of FIG. 5, noise emissions are clearly reduced in the FPC cable assembly of the present disclosure as compared to the conventional FPC cable incorporating EMI film shielding. The configurations of the present disclosure provides good mitigation of RF desensitization across a broad frequency range.

Referring to FIG. 7, a method 200 is described for manufacturing the FPC cable assembly of the first example or the second example of the present disclosure. The following description of the method 200 is provided with reference to the hardware components described above and shown in FIGS. 1-5.

At step 202, the method includes providing an FPC cable with a first ground layer, a second ground layer, and at least one signal line sandwiched between the first ground layer and the second ground layer.

At step 204, the method includes shielding the flexible printed circuit cable with an electromagnetic shielding structure. The shielding is typically accomplished by performing steps 206, 208, and 210. At step 206, the method includes, at least partially covering the first ground layer with a first magnetic layer on an outside thereof and electrically grounding the first magnetic layer to the first ground layer. At step 208, the method includes at least partially covering the second ground layer with a second magnetic layer on an outside thereof and electrically grounding the second magnetic layer to the second ground layer. At step 210, the method includes magnetically engaging and electrically contacting a plurality of magnetic rings with the first magnetic layer and the second magnetic layer so as to surround the first and second ground layers, the signal lines, and the first and second magnetic layers. As described above, the first and second magnetic layers may have a hard coercivity which is higher than a predetermined coercivity threshold, and the plurality of magnetic rings may have a soft coercivity which is lower than the hard coercivity.

The above-described devices and method may be used to reduce unwanted electromagnetic noise emissions from the FPC cable assembly, and particularly from the side edges of the FPC cable assembly, so that electromagnetic interference with wireless communications from wireless radio transceivers can be inhibited and RF desensitization can be avoided in electronic devices that communicate with wireless radio transceivers, such as laptop devices, smart phones and tablets, routers, desktop computers, and IoT devices. The flexibility and configurability of the soft magnetic rings allow spacing adjustments to accommodate sections where the FPC cable assembly is bent by reducing the resistance to bending in the longitudinal direction of the FPC cable assembly, which can be useful to traverse barriers such as hinges within a housing of an electronic device.

Figure 8:
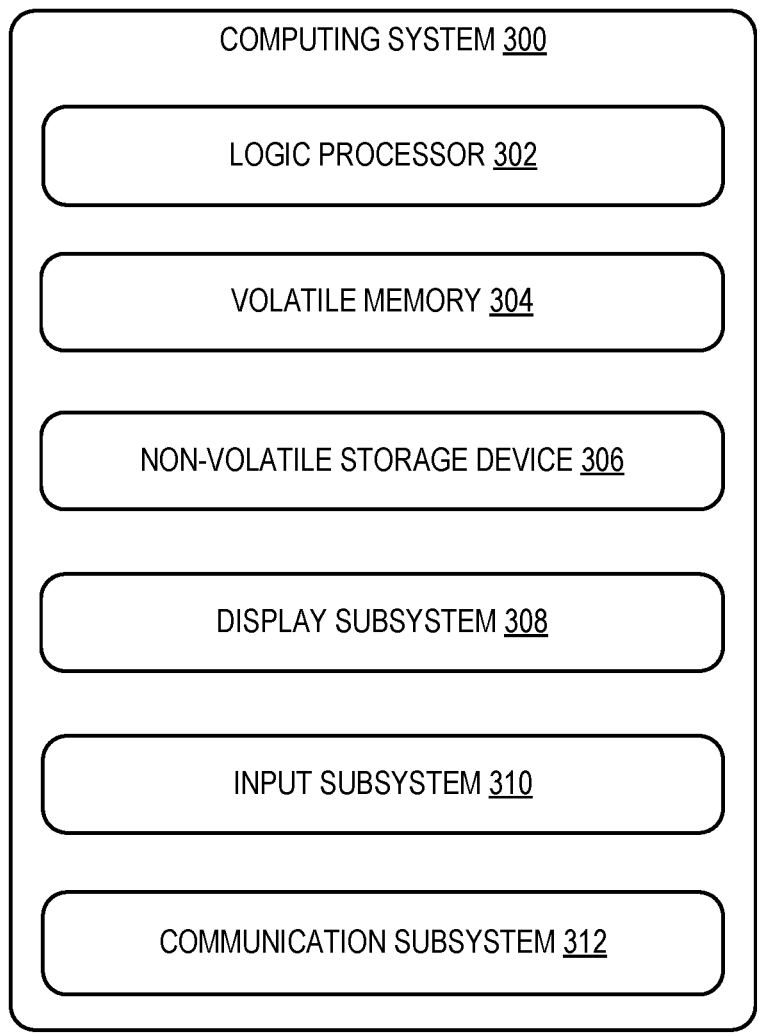
FIG. 8 shows a schematic view of an example computing architecture of the electronic devices of FIGS. 3 and 4A-4C.

FIG. 8 schematically shows a non-limiting embodiment of a computing system 300. Computing system 300 is shown in simplified form. Computing system 300 can embody the electronic devices 5 and 5A described above. Computing system 300 can take the form of one or more personal computers, server computers, tablet computers, home-entertainment computers, network computing devices, gaming devices, mobile computing devices, mobile communication devices (e.g., smart phone), wearable computing devices such as head mounted augmented reality devices, and/or other computing devices.

Computing system 300 includes a logic processor 302, volatile memory 304, and a non-volatile storage device 306. Computing system 300 can optionally include a display subsystem 308, input subsystem 310, communication subsystem 312, and/or other components not shown in earlier Figures. One or more printed circuit boards may be provided, to which the logic processor 302, volatile memory 304, and a non-volatile storage device 306 may be mounted. These components may communicate with each other via a communications bus. One or more FPC cable assemblies described above may connect these components to each other, as well.

Logic processor 302 includes one or more physical devices configured to execute instructions. The logic processor 302 can include one or more physical processors (hardware) configured to execute software instructions. Additionally or alternatively, the logic processor can include one or more hardware logic circuits or firmware devices configured to execute hardware-implemented logic or firmware instructions.

Communication subsystem 312 may be configured to communicatively couple various computing devices described herein with each other, and with other devices. Communication subsystem 312 can include wired and/or wireless communication devices compatible with one or more different communication protocols. As non-limiting examples, the communication subsystem include a wireless radio transceiver configured for communication via 4G, 5G, or LTE mobile data network connections, Wi-Fi connections, BLUETOOTH connections, or connections via other communications protocols. In some embodiments, the communication subsystem can allow computing system 300 to send and/or receive messages to and/or from other devices via a network such as the Internet.

It will be appreciated that the terms "includes," "including," "has," "contains," variants thereof, and other similar words used in either the detailed description or the claims are intended to be inclusive in a manner similar to the term "comprising" as an open transition word without precluding any additional or other elements.

It will be appreciated that "and/or" as used herein refers to the logical disjunction operation, and thus A and/or B has the following truth table.

| A | B | A and/or B |
|---|---|---|
| T | T | T |
| T | F | T |
| F | T | T |
| F | F | F |

The following paragraphs provide additional support for the claims of the subject application. One aspect provides a flexible printed circuit (FPC) cable assembly comprising an FPC cable including a first ground layer; a second ground layer; at least one signal line sandwiched by the first ground layer and the second ground layer; and an electromagnetic shielding structure configured to electromagnetically shield the FPC cable, the electromagnetic shielding structure including a first magnetic layer at least partially covering the first ground layer on an outside thereof and being electrically grounded to the first ground layer; a second magnetic layer at least partially covering the second ground layer on an outside thereof and being electrically grounded to the second ground layer; and a plurality of magnetic rings magnetically engaged with and electrically contacting the first magnetic layer and the second magnetic layer so as to surround the first and second ground layers, the at least one signal line, and the first and second magnetic layers. In this aspect, additionally or alternatively, the first magnetic layer may be a first hard magnetic layer; the second magnetic layer may be a second hard magnetic layer; and the plurality of magnetic rings may be a plurality of soft magnetic rings. In this aspect, additionally or alternatively, the first and second hard magnetic layers may have a hard coercivity which is higher than a predetermined coercivity threshold; and the plurality of soft magnetic rings may have a soft coercivity which is lower than the hard coercivity. In this aspect, additionally or alternatively, the soft magnetic rings may comprise at least one of Fe or Ni—Fe; and the first and second hard magnetic layers may comprise at least one of Sm—Co or NdFeB. In this aspect, additionally or alternatively, the plurality of magnetic rings may include a plurality of pairs of adjacent magnetic rings; each pair of adjacent magnetic rings may be separated by a respective distance d, defined by the formula $d \leq c/(4f)$, where c is the speed of light and f is a largest frequency of radiated emissions from the FPC cable assembly. In this aspect, additionally or alternatively, in at least a first section of the FPC cable assembly, the distance separating the adjacent pairs of the plurality of magnetic rings may be a first predetermined distance. In this aspect, additionally or alternatively, in at least a second section of the FPC cable assembly, the distance separating the adjacent pairs of the plurality of magnetic rings may be a second predetermined distance that is larger than the first predetermined distance. In this aspect, additionally or alternatively, widths of the plurality of magnetic rings in the first section may be greater than widths of the plurality of magnetic rings in a second section of the FPC cable assembly. In this aspect, additionally or alternatively, in at least a first section of the FPC cable assembly, the adjacent pairs of the plurality of magnetic rings may be separated by a first set of distances that vary from each other. In this aspect, additionally or alternatively, in at least a second section of the FPC cable assembly, the adjacent pairs of the plurality of magnetic rings may be separated by a second set of distances that vary from each other and all of which are larger than the distances in the first set.

Another aspect provides an electronic device, comprising a housing; a wireless radio transceiver mounted in the housing; a first electronic component mounted in the housing; a second electronic component mounted in the housing; and a flexible printed circuit cable assembly configured at least partially bend to connect the first electronic component to the second electronic component, the FPC cable assembly including an FPC cable including a first ground layer; a second ground layer; at least one signal line sandwiched by the first ground layer and the second ground layer; and an electromagnetic shielding structure configured to electromagnetically shield the flexible printed circuit cable so as to inhibit an effect of electromagnetic interference from the at least one signal line on an operation of the wireless radio transceiver, the electromagnetic shielding structure including a first magnetic layer at least partially covering the first ground layer on an outside thereof and being electrically grounded to the first ground layer; a second magnetic layer at least partially covering the second ground layer on an outside thereof and being electrically grounded to the second ground layer; and a plurality of magnetic rings magnetically engaged with and electrically contacting the first magnetic layer and the second magnetic layer so as to surround the first and second ground layers, the at least one signal line, and the first and second magnetic layers. In this aspect, additionally or alternatively, the first electronic component may be a printed circuit board; the second electronic component may be a display or a printed circuit board. In this aspect, additionally or alternatively, the electronic device may further comprise a hinge, where the housing may include a first housing portion and a second housing portion configured to rotate relative to each other about the hinge; and the FPC cable assembly may be configured to bend around the hinge. In this aspect, additionally or alternatively, the first magnetic layer may be a first hard magnetic layer; the second magnetic layer may be a second hard magnetic layer; the plurality of magnetic rings may be a plurality of soft magnetic rings; the first and second hard magnetic layers may have a hard coercivity which is higher than a predetermined coercivity threshold; and the plurality of soft magnetic rings may have a soft coercivity which is lower than the hard coercivity. In this aspect, additionally or alternatively, the plurality of magnetic rings may include a plurality of pairs of adjacent magnetic rings; each pair of adjacent magnetic rings may be separated by a respective distance d, defined by the formula $d \leq c/(4f)$, where c is the speed of light and f is a largest frequency of radiated emissions from the FPC cable assembly. In this aspect, additionally or alternatively, the FPC cable assembly may include a first section and a second section, the second section may be configured to bend around the hinge, and each respective distance between each pair of adjacent rings in the second section may be larger than each respective distance between each pair of adjacent rings in the first section. In this aspect, additionally or alternatively, the respective distances between adjacent rings in the first section may be a first predetermined distance in length, and the respective distances between the adjacent rings in the second section may be a second predetermined distance in length that is larger than the first predetermined distance in length. In this aspect, additionally or alternatively, widths of the plurality of magnetic rings in the first section may be greater than widths of the plurality of magnetic rings in the second section. In this aspect, additionally or alternatively, the adjacent pairs of the plurality of magnetic rings may be separated by a first set of distances that vary from each other.

Another aspect provides a method of manufacturing a flexible printed circuit (FPC) cable assembly, the method comprising providing an FPC cable with a first ground layer, a second ground layer, and at least one signal line sandwiched between the first ground layer and the second ground layer; shielding the flexible printed circuit cable with an electromagnetic shielding structure by at least partially covering the first ground layer with a first magnetic layer on an outside thereof and electrically grounding the first magnetic layer to the first ground layer; at least partially covering the second ground layer with a second magnetic layer on an outside thereof and electrically grounding the second magnetic layer to the second ground layer; and magnetically engaging and electrically contacting a plurality of magnetic rings with the first magnetic layer and the second magnetic layer so as to surround the first and second ground layers, the at least one signal line, and the first and second magnetic layers. It will be understood that the configurations and/or approaches described herein are exemplary in nature, and that these specific embodiments or examples are not to be considered in a limiting sense, because numerous variations are possible. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A flexible printed circuit (FPC) cable assembly comprising:
   an FPC cable including:
      a first ground layer;
      a second ground layer;
      at least one signal line sandwiched by the first ground layer and the second ground layer; and
   an electromagnetic shielding structure configured to electromagnetically shield the FPC cable, the electromagnetic shielding structure including:
      a first magnetic layer at least partially covering the first ground layer on an outside thereof and being electrically grounded to the first ground layer;
      a second magnetic layer at least partially covering the second ground layer on an outside thereof and being electrically grounded to the second ground layer; and
      a plurality of magnetic rings magnetically engaged with and electrically contacting the first magnetic layer and the second magnetic layer so as to surround the first and second ground layers, the at least one signal line, and the first and second magnetic layers, wherein
   the plurality of magnetic rings are spaced apart from each other along the at least one signal line.

2. The FPC cable assembly of claim 1, wherein
   the first magnetic layer is a first hard magnetic layer;
   the second magnetic layer is a second hard magnetic layer; and
   the plurality of magnetic rings are a plurality of soft magnetic rings.

3. The FPC cable assembly of claim 2, wherein
the first and second hard magnetic layers have a hard coercivity which is higher than a coercivity threshold; and
the plurality of soft magnetic rings have a soft coercivity which is lower than the hard coercivity.

4. The FPC cable assembly of claim 3, wherein
the soft magnetic rings comprise at least one of Fe or Ni—Fe; and
the first and second hard magnetic layers comprise at least one of Sm—Co or NdFeB.

5. The FPC cable assembly of claim 1, wherein
the plurality of magnetic rings includes a plurality of pairs of adjacent magnetic rings;
each pair of adjacent magnetic rings are separated by a respective distance d, defined by the formula:

$d \leq c/(4f)$, where c is the speed of light and f is a largest frequency of radiated emissions from the FPC cable assembly.

6. The FPC cable assembly of claim 5, wherein
in at least a first section of the FPC cable assembly, the distance separating the adjacent pairs of the plurality of magnetic rings is a first predetermined distance.

7. The FPC cable assembly of claim 6, wherein
in at least a second section of the FPC cable assembly, the distance separating the adjacent pairs of the plurality of magnetic rings is a second predetermined distance that is larger than the first predetermined distance.

8. The FPC cable assembly of claim 6, wherein widths of the plurality of magnetic rings in the first section are greater than widths of the plurality of magnetic rings in a second section of the FPC cable assembly.

9. The FPC cable assembly of claim 1, wherein
in at least a first section of the FPC cable assembly, the adjacent pairs of the plurality of magnetic rings are separated by a first set of distances that vary from each other.

10. The FPC cable assembly of claim 9, wherein
in at least a second section of the FPC cable assembly, the adjacent pairs of the plurality of magnetic rings are separated by a second set of distances that vary from each other and all of which are larger than the distances in the first set.

11. An electronic device, comprising:
a housing;
a wireless radio transceiver mounted in the housing;
a first electronic component mounted in the housing;
a second electronic component mounted in the housing; and
a flexible printed circuit cable assembly configured at least partially bend to connect the first electronic component to the second electronic component, the FPC cable assembly including:
an FPC cable including:
a first ground layer;
a second ground layer;
at least one signal line sandwiched by the first ground layer and the second ground layer; and
an electromagnetic shielding structure configured to electromagnetically shield the flexible printed circuit cable so as to inhibit an effect of electromagnetic interference from the at least one signal line on an operation of the wireless radio transceiver, the electromagnetic shielding structure including:
a first magnetic layer at least partially covering the first ground layer on an outside thereof and being electrically grounded to the first ground layer;
a second magnetic layer at least partially covering the second ground layer on an outside thereof and being electrically grounded to the second ground layer; and
a plurality of magnetic rings magnetically engaged with and electrically contacting the first magnetic layer and the second magnetic layer so as to surround the first and second ground layers, the at least one signal line, and the first and second magnetic layers, wherein
the plurality of magnetic rings are spaced apart from each other along the at least one signal line.

12. The electronic device of claim 11, wherein
the first electronic component is a printed circuit board;
the second electronic component is a display or a printed circuit board.

13. The electronic device of claim 11, further comprising:
a hinge, wherein
the housing includes a first housing portion and a second housing portion configured to rotate relative to each other about the hinge; and
the FPC cable assembly is configured to bend around the hinge.

14. The electronic device of claim 11, wherein
the first magnetic layer is a first hard magnetic layer;
the second magnetic layer is a second hard magnetic layer;
the plurality of magnetic rings are a plurality of soft magnetic rings;
the first and second hard magnetic layers have a hard coercivity which is higher than a coercivity threshold; and
the plurality of soft magnetic rings have a soft coercivity which is lower than the hard coercivity.

15. The electronic device of claim 14, wherein
the plurality of magnetic rings includes a plurality of pairs of adjacent magnetic rings;
each pair of adjacent magnetic rings are separated by a respective distance d, defined by the formula:

$d \leq c/(4f)$, where c is the speed of light and f is a largest frequency of radiated emissions from the FPC cable assembly.

16. The electronic device of claim 15, wherein
the FPC cable assembly includes a first section and a second section,
the second section is configured to bend around the hinge, and
each respective distance between each pair of adjacent rings in the second section is larger than each respective distance between each pair of adjacent rings in the first section.

17. The electronic device of claim 16, wherein
the respective distances between adjacent rings in the first section are a first predetermined distance in length, and
the respective distances between the adjacent rings in the second section are a second predetermined distance in length that is larger than the first predetermined distance in length.

18. The electronic device of claim 16, wherein widths of the plurality of magnetic rings in the first section are greater than widths of the plurality of magnetic rings in the second section.

19. The electronic device of claim 15, wherein
the adjacent pairs of the plurality of magnetic rings are separated by a first set of distances that vary from each other.

20. A method of manufacturing a flexible printed circuit (FPC) cable assembly, the method comprising:
providing an FPC cable with a first ground layer, a second ground layer, and at least one signal line sandwiched between the first ground layer and the second ground layer;
shielding the flexible printed circuit cable with an electromagnetic shielding structure by:
at least partially covering the first ground layer with a first magnetic layer on an outside thereof and electrically grounding the first magnetic layer to the first ground layer;
at least partially covering the second ground layer with a second magnetic layer on an outside thereof and electrically grounding the second magnetic layer to the second ground layer; and
magnetically engaging and electrically contacting a plurality of magnetic rings with the first magnetic layer and the second magnetic layer so as to surround the first and second ground layers, the at least one signal line, and the first and second magnetic layers, wherein
the plurality of magnetic rings are spaced apart from each other along the at least one signal line.

\* \* \* \* \*